(12) United States Patent
Li et al.

(10) Patent No.: US 10,714,509 B2
(45) Date of Patent: Jul. 14, 2020

(54) DISPLAY PANEL AND DISPLAY DEVICE

(71) Applicant: Wuhan China Star Optoelectronics Technology Co., Ltd., Wuhan, Hubei (CN)

(72) Inventors: Yafeng Li, Guangdong (CN); Jinfang Wu, Guangdong (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 106 days.

(21) Appl. No.: 15/744,615

(22) PCT Filed: Dec. 21, 2017

(86) PCT No.: PCT/CN2017/117794
§ 371 (c)(1),
(2) Date: Jan. 12, 2018

(87) PCT Pub. No.: WO2019/061885
PCT Pub. Date: Apr. 4, 2019

(65) Prior Publication Data
US 2019/0096923 A1 Mar. 28, 2019

(30) Foreign Application Priority Data
Sep. 26, 2017 (CN) .......................... 2017 1 0882448

(51) Int. Cl.
*H01L 27/12* (2006.01)
*G06F 3/041* (2006.01)

(52) U.S. Cl.
CPC ...... *H01L 27/1244* (2013.01); *H01L 27/1248* (2013.01); *G06F 3/0412* (2013.01)

(58) Field of Classification Search
CPC .............. G06F 3/0412; H01L 27/1244; H01L 27/1248
(Continued)

(56) References Cited

U.S. PATENT DOCUMENTS 9,287,329 B1 * 3/2016 Lee ..................... H01L 51/0097
2010/0084657 A1 4/2010 Tseng
(Continued)

FOREIGN PATENT DOCUMENTS

CN 104965368 A 10/2015
CN 205067932 U 3/2016
(Continued)

*Primary Examiner* — Jason M Mandeville
(74) *Attorney, Agent, or Firm* — Hemisphere Law, PLLC; Zhigang Ma

(57) ABSTRACT

The present disclosure provides a display panel including a display area and a non-display area, a base substrate, a plurality of thin film transistors, a plurality of touch signal lines, a first test signal line area, an array substrate row driving circuit, a second test signal line area, a ground line area and an insulating layer. The thin film transistor includes a gate, a gate insulating layer, a source and a drain. The non-display area includes a first side and a second side; the array substrate row driving circuit respectively forms a first gap and a second gap with the first test signal line area and the second test signal line area, an orthographic projection of the ground line area on the base substrate is in the projection of the second test signal line area in the base substrate. The present disclosure also provides a display device.

10 Claims, 2 Drawing Sheets

(58) Field of Classification Search
USPC .......................................................... 345/173
See application file for complete search history.

(56) References Cited

U.S. PATENT DOCUMENTS

2017/0271368 A1* 9/2017 Zhang .................... H01L 27/124
2018/0108314 A1* 4/2018 Cao ........................ H01L 27/124
2019/0066595 A1* 2/2019 Kim ...................... G09G 3/3258

FOREIGN PATENT DOCUMENTS

| CN | 105807523 A | 7/2016 |
| CN | 205609530 U | 9/2016 |
| CN | 106020530 A | 10/2016 |
| CN | 106154632 A | 11/2016 |
| CN | 107491223 A | 12/2017 |

* cited by examiner

DISPLAY PANEL AND DISPLAY DEVICE

RELATED APPLICATIONS

The present application is a National Phase of International Application Number PCT/CN2017/117794, filed Dec. 21, 2017, and claims the priority of China Application CN 201710882448.4, filed Sep. 26, 2017.

FIELD OF THE DISCLOSURE

The present disclosure relates to a display technology field, and more particularly to a display panel and a display device.

BACKGROUND OF THE DISCLOSURE

In the current field of lighting and display, due to the high mobility of low-temperature polysilicon (LTPS), more and more research has been widely used to develop the lighting products and the panel industry to meet the needs of the industry of ultra-narrow bezel.

For ultra-narrow bezel display panels, antistatic striking capability is an important factor in the quality of display panels. In the current display panel industry, mainly by adding a circle around the panel ground line, the driving signal is wrapped in the loop surrounded by a loop inside, in the antistatic test on the panel, the static discharge will be released by the ground line loop. However, because of the antistatic striking capability and the distance from the panel to the ground line, the width of the ground line and the distance between the ground line and the signal are proportional, the design of the ultra-narrow bezel will result in a narrower width of the three, so that greatly reduces the antistatic striking capability of the panel.

SUMMARY OF THE DISCLOSURE

An object of the present disclosure is to provide a display panel and a display device for improving the antistatic striking capability of the ultra-narrow bezel display panel and the display device.

The display panel of the present disclosure includes a display area and a non-display area located on two sides of the display area.

The display panel further includes a base substrate, a plurality of thin film transistors disposed on the base substrate, a plurality of touch signal lines, a first test signal line area, an array substrate row driving circuit, a second test signal line area and a ground line area.

Wherein an insulating layer is between the thin film transistor and the touch signal line in the display area, the thin film transistor includes a gate, a gate insulating layer, a source and a drain.

The non-display area includes a first side and a second side spaced apart from the first side; the first test signal line area includes a first side and a second side opposite to the first side; in the non-display area, the first side is adjacent to the first side of the first test signal line area, a first gap is formed between the second side of the first test signal line area and the array substrate row driving circuit, a second gap is formed between the array substrate row driving circuit and the second test signal line area, and a third gap is formed between the ground line area and the second side, an orthographic projection of the ground line area on the base substrate is partially located within an orthographic projection of the second test signal line area on the base substrate.

Wherein the second test signal line area is formed in a same layer as the gate, and the ground line area is formed in a same layer as the source and the drain.

Wherein the second test signal line area is formed in a same layer as the gate, and the ground line area is formed in a same layer as the touch signal line.

Wherein the second test signal line area is formed in a same layer as the source and the drain, and the ground line area and the touch signal line are formed in a same layer.

Wherein the second test signal line area is formed in a same layer as the gate, the ground line area is formed at an overlap between the source and the drain and the touch signal line, the source and the drain and the touch signal line are overlapped via a drilling hole.

The present disclosure further provides a display device, the display device includes the above display panel.

Wherein the second test signal line area is formed in a same layer as the gate, and the ground line area is formed in a same layer as the source and the drain.

Wherein the second test signal line area is formed in a same layer as the gate, and the ground line area is formed in a same layer as the touch signal line.

Wherein the second test signal line area is formed in a same layer as the source and the drain, and the ground line area and the touch signal line are formed in a same layer.

Wherein the second test signal line area is formed in a same layer as the gate, the ground line area is formed at an overlap between the source and the drain and the touch signal line, the source and the drain and the touch signal line are overlapped via a drilling hole.

A display panel and a display device provided by the present disclosure move a test signal line area for testing that does not affect the final display effect of the panel to the outside and overlap the test signal line area through the ground line area. Under certain circumstances, the frame of the panel increases the distance of the ground line area from the adjacent signal, thereby improving antistatic striking capability of the display panel and the display device.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DETAILED DESCRIPTION OF PREFERRED EMBODIMENTS

The technical solutions in the embodiments of the present disclosure will be described clearly and completely hereinafter with reference to the accompanying drawings in the embodiments of the present disclosure. Apparently, the described embodiments are merely a part but not all embodiments of the present disclosure. All other embodiments obtained by a person of ordinary skill in the art based on the embodiments of the present disclosure without creative efforts shall fall within the protection scope of the present disclosure.

Figure 1:
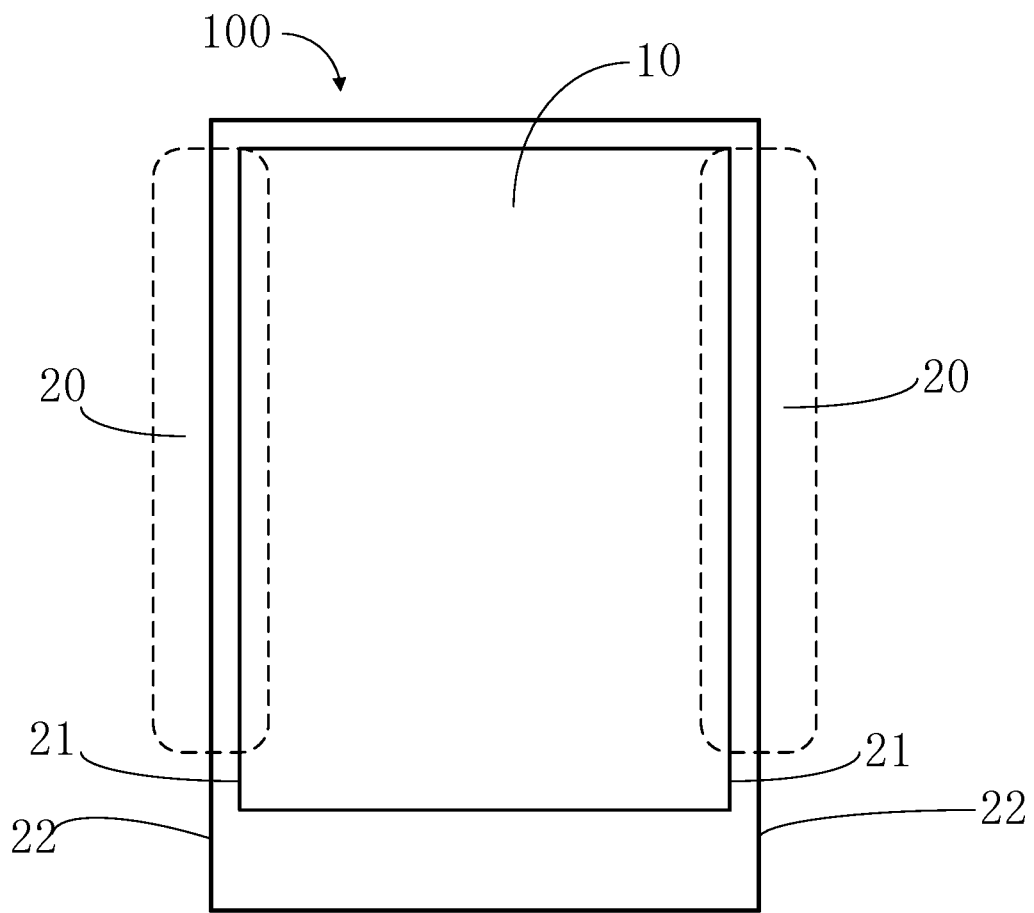
FIG. 1 is a schematic diagram of the display panel of the present disclosure.

Referring to FIG. 1, the embodiments of the present disclosure provide a display panel for improving the antistatic striking capability of a narrow bezel panel. The display panel 100 includes a display area 10 and a non-display area 20. The display panel 100 includes, but is not limited to, a low-temperature polysilicon panel, an amorphous silicon panel, and a metal oxide panel.

Figure 2:
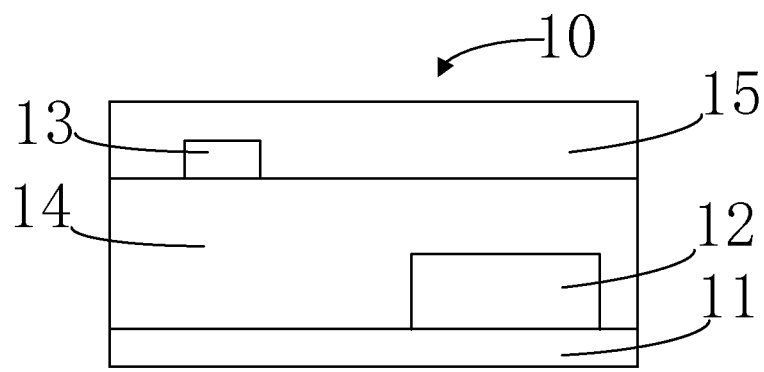
FIG. 2 is a schematic side view of the display area shown in FIG. 1.

Referring to FIG. 2, the display area 10 includes a base substrate 11, a plurality of thin film transistors 12 (only one is shown in FIG. 2) on the base substrate 11, and a plurality of touch signal lines 13. The base substrate 11 may be glass or transparent plastic, and the thin film transistors 12 are spaced apart and arranged in an array on the base substrate. The display area further includes a planarization layer 14 and an insulating layer 15. The planarization layer 14 is located between the thin film transistor 12 and the touch signal line 13. The insulating layer 15 covers the touch signal line 13.

Figure 3:
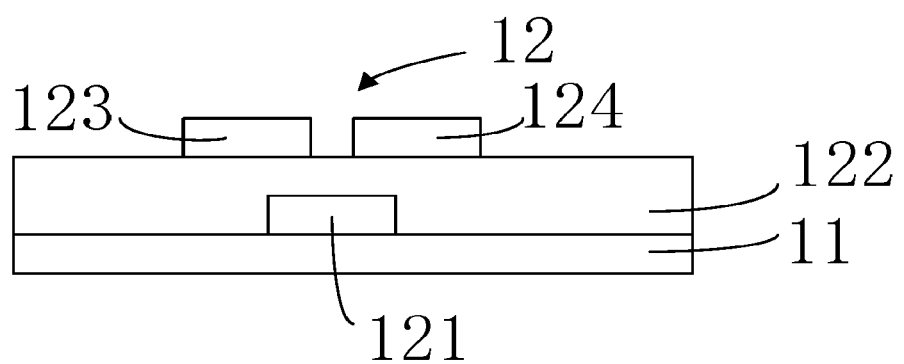
FIG. 3 is a schematic side view of the thin film transistor in the display area shown in FIG. 1.

Referring to FIG. 3, the thin film transistor 12 includes a gate 121, a gate insulating layer 122, a source 123 and a drain 124. The gate insulating layer 122 is located between the gate 121 and the source 123 and the drain 124. The gate 121 controls the switching of the thin film transistor 12. A conductive channel is formed between the source 123 and the drain 124 for the conductance of the thin film transistor 12. The material of the gate 121, the source 123 and the drain 124 is metal. For example, the gate 121, the source 123 and the drain 124 may be a single layer of any one of copper, aluminum, copper alloy or aluminum alloy. The material of the gate insulating layer 122 includes silicon nitride ($SiN_x$) and silicon oxide ($SiO_x$).

It should be noted that, for the convenience of description, only part of the structure of the display area related to the embodiment of the present disclosure is shown instead of the entire structure of the display area.

Figure 4:
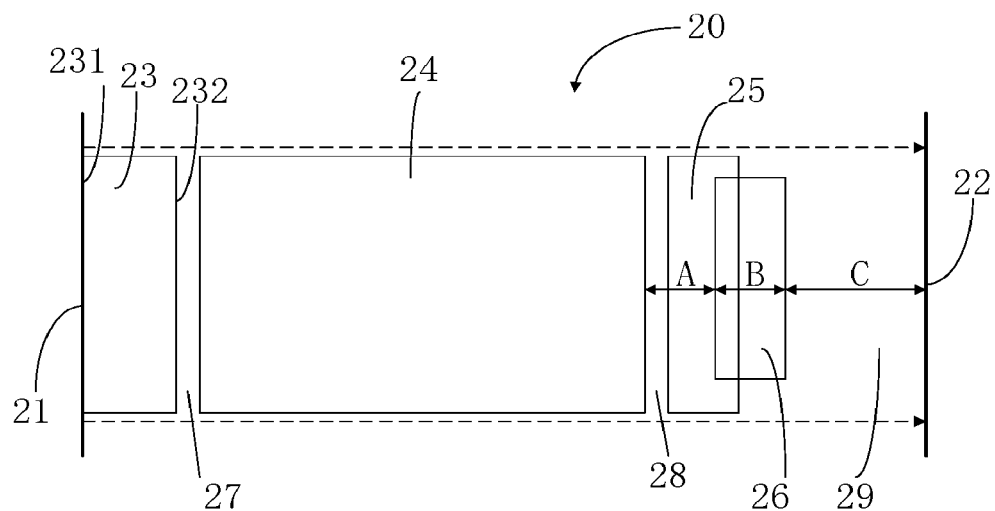
FIG. 4 is an enlarged schematic diagram of the non-display area shown in FIG. 1.

Referring to FIG. 4, the non-display area 20 includes a first side 21, a second side 22, a first test signal line area 23, an array substrate row driving circuit 24, a second test signal line area 25 and a ground line area 26. The first test signal line area 23 includes a first side 231 and a second side 232 opposite to the first side. The first side 231 of the first test signal line area 23 is in contact with the second side 21, a first gap 27 is formed between the second side 232 of the first test signal line area 23 and the array substrate row driving circuit 24. A second gap 28 is formed between the array substrate row driving 24 and the second test signal line area 25. A third gap 29 is formed between the ground line area 26 and the second side 22. An orthographic projection of the ground line area 26 on the base substrate 11 is partially located within the projection of the second test signal line area 25 on the base substrate 11.

The first test signal line area 23 is for placing a signal line for testing a signal related to a final display effect of the display panel 100. The second test signal line area 25 is used for placing signal lines for testing signals not related to the final display effect of the display panel 100 (Such as array substrate test signal, display panel test signal and touch signal, etc.). Even if these signals are damaged by static electricity, the second test signal line area 25 does not affect the final display effect of the panel. The ground line area 26 is for placing a ground line, the ground line area 26 forms a loop around the display area 10, the first test line area 23 and the array substrate row driving circuit 24 are wrapped. During the testing of the antistatic striking capability of the display panel 100, the static electricity is released by the loop through the ground line in the ground line area 26 to protect the display panel 100 from being electrostatically damaged.

In general, the distance A between the ground line area 26 and the array substrate row driving circuit 24, the width B of the ground line area 26, and the width C of the third gap 29 are important factors that affect the antistatic striking capability of the display panel 100. Under certain conditions of B and C, the larger the A is, the stronger the antistatic striking capability of the panel is. Under certain conditions of A and C, the larger the B is, the stronger the antistatic striking capability of the panel is. Under certain conditions of A and B, the larger the C is, the stronger the antistatic striking capability of the panel is. The width C of the third gap 29 has the greatest influence on the antistatic striking capability of the display panel 100.

In a first implementation manner of the present embodiment, the second test signal line area 25 is formed in the same layer as the gate 121, the ground line area 26 is formed in the same layer as the source 123 and the drain 124.

In a second implementation manner of the present embodiment, the second test signal line area 25 and the gate 121 are formed in the same layer, and the ground line area 26 and the touch signal line 13 are formed in the same layer.

In a third implementation manner of the present embodiment, the second test signal line area 25 is formed in the same layer as the source 123 and the drain 124, the ground line area 26 is connected to the touch signal line 13 in the same layer.

In a fourth implementation manner of the present embodiment, the second test signal line area 25 and the gate 121 are formed in the same layer, the ground line area 26 is formed at an overlap between the source 123 and the drain 124 and the touch signal line 13, the source 123 and the drain 124 and the touch signal line 13 are overlapped via a drilling hole.

Compared with the prior art, the present disclosure moves the test signal line area in the display panel for placing the test without affecting the final display effect of the panel to the outside. By overlapping the ground line area with the part of the test signal line area, the width of the boundary between the ground line area and the display panel is increased under the condition that the border of the display panel is constant, so that the antistatic striking capability of the display panel is improved.

The present disclosure further provides a display device, which includes the above display panel 100 and a backlight module. The backlight module is attached to the back of the display panel 100 to provide a light source for the display panel 100.

The display device provided by the present disclosure moves the test signal line area in the original display panel for placing the test without affecting the final display effect of the display panel to the outside. The area of the ground line overlaps with the area of the test signal line, and the width of the boundary between the ground line area and the display panel is increased under the condition that the border of the display panel is fixed, thereby improving the antistatic striking capability of the display device. The above disclosure is only the preferred embodiments of the present disclosure, and certainly can not be used to limit the scope of the present disclosure. Persons of ordinary skill in the art may understand that all or part of the procedures for implementing the foregoing embodiments and equivalent changes made according to the claims of the present disclosure still fall within the scope of the present disclosure.

What is claimed is:

1. A display panel, comprising a display area and a non-display area located on two sides of the display area;
wherein the display area comprises a base substrate, a plurality of thin film transistors disposed on the base substrate, and a plurality of touch signal lines, and each non-display area comprises a first test signal line area, an array substrate row driving circuit, a second test signal line area and a ground line area forming a loop around the display area;
wherein an insulating layer is between the thin film transistor and the touch signal line in the display area, the thin film transistor comprises a gate, a gate insulating layer, a source and a drain;
each non-display area comprises a first edge close to the display area and a second edge spaced apart from the first edge distant from the display area; in each non-display area, the first test signal line area comprising a first test signal line for testing a signal related to a final display effect of the display panel, the array substrate row driving circuit, the second test signal line area comprising a plurality of second test signal lines for testing signals not related to the final display effect of the display panel, and the ground line area comprising a ground line are arranged in sequence along a horizontal direction from the first edge toward the second edge; the first test signal line area comprises a first side and a second side opposite to the first side; the first edge is adjacent to the first side of the first test signal line area, a first gap is formed between the second side of the first test signal line area and the array substrate row driving circuit, a second gap is formed between the array substrate row driving circuit and the second test signal line area, and a third gap is formed between the ground line area and the second edge, wherein the first gap, the second gap, and the third gap each have a predetermined width;
an orthographic projection of the ground line area on the base substrate is partially located overlapped within an orthographic projection of the second test signal line area on the base substrate.

2. The display panel according to claim 1, wherein the second test signal line area is formed in a same layer as the gate, and the ground line area is formed in a same layer as the source and the drain.

3. The display panel according to claim 1, wherein the second test signal line area is formed in a same layer as the gate, and the ground line area is formed in a same layer as the touch signal line.

4. The display panel according to claim 1, wherein the second test signal line area is formed in a same layer as the source and the drain, and the ground line area and the touch signal line are formed in a same layer.

5. The display panel according to claim 1, wherein the second test signal line area is formed in a same layer as the gate, in the ground line area, the source and the drain are overlapped with the touch signal line and are connected to the touch signal line via a drilling hole.

6. A display device, comprising a display panel, wherein the display comprises a display area and a non-display area located on two sides of the display area;
wherein the display area comprises a base substrate, a plurality of thin film transistors disposed on the base substrate, and a plurality of touch signal lines, and each non-display area comprises a first test signal line area, an array substrate row driving circuit, a second test signal line area and a ground line area forming a loop around the display area;
wherein an insulating layer is between the thin film transistor and the touch signal line in the display area, the thin film transistor comprises a gate, a gate insulating layer, a source and a drain;
each non-display area comprises a first edge close to the display area and a second edge spaced apart from the first edge distant from the display area; in each non-display area, the first test signal line area comprising a first test signal line for testing a signal related to a final display effect of the display panel, the array substrate row driving circuit, the second test signal line area comprising a plurality of second test signal lines for testing signals not related to the final display effect of the display panel, and the ground line area comprising a ground line are arranged in sequence along a horizontal direction from the first edge toward the second edge; the first test signal line area comprises a first side and a second side opposite to the first side; the first edge is adjacent to the first side of the first test signal line area, a first gap is formed between the second side of the first test signal line area and the array substrate row driving circuit, a second gap is formed between the array substrate row driving circuit and the second test signal line area, and a third gap is formed between the ground line area and the second edge, wherein the first gap, the second gap, and the third gap each have a predetermined width;
an orthographic projection of the ground line area on the base substrate is partially located overlapped within an orthographic projection of the second test signal line area on the base substrate.

7. The display device according to claim 6, wherein the second test signal line area is formed in a same layer as the gate, and the ground line area is formed in a same layer as the source and the drain.

8. The display device according to claim 6, wherein the second test signal line area is formed in a same layer as the gate, and the ground line area is formed in a same layer as the touch signal line.

9. The display device according to claim 6, wherein the second test signal line area is formed in a same layer as the source and the drain, and the ground line area and the touch signal line are formed in a same layer.

10. The display device according to claim 6, wherein the second test signal line area is formed in a same layer as the gate, in the ground line area, the source and the drain are overlapped with the touch signal line and are connected to the touch signal line via a drilling hole.

* * * * *